(12) United States Patent
Maehara

(10) Patent No.: US 7,659,499 B2
(45) Date of Patent: Feb. 9, 2010

(54) PHOTOELECTRIC CONVERSION DEVICE AND SOLID-STATE IMAGING DEVICE

(75) Inventor: Yoshiki Maehara, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 502 days.

(21) Appl. No.: 11/723,110

(22) Filed: Mar. 16, 2007

(65) Prior Publication Data

US 2007/0215204 A1    Sep. 20, 2007

(30) Foreign Application Priority Data

Mar. 16, 2006   (JP)   ............................... 2006-073160

(51) Int. Cl.
   *H01L 27/14*   (2006.01)
(52) U.S. Cl. ................. 250/208.1; 250/214.1; 257/291; 257/432; 257/E27.13; 257/E27.159
(58) Field of Classification Search ............. 250/208.1, 250/214.1; 257/291, 432, E27.13, E27.159
See application file for complete search history.

(56) References Cited

U.S. PATENT DOCUMENTS

| 2006/0196533 A1* | 9/2006 | Maehara | 136/243 |
| 2007/0215204 A1* | 9/2007 | Maehara | 136/256 |
| 2008/0246107 A1* | 10/2008 | Maehara | 257/432 |

FOREIGN PATENT DOCUMENTS

| JP | 58-103165 A | 6/1983 |
| JP | 2002-083946 A | 3/2002 |

* cited by examiner

*Primary Examiner*—John R Lee
(74) *Attorney, Agent, or Firm*—Sughrue Mion, PLLC

(57) ABSTRACT

A photoelectric conversion device including: a first electrode; a photoelectric conversion layer; and a second electrode, in this order, wherein the photoelectric conversion device further includes: a deterioration factor adsorptive and/or reactive layer which covers the first electrode, the photoelectric conversion layer and the second electrode and which has at least one of adsorptivity of adsorbing a deterioration factor and reactivity of reacting with the deterioration factor; and a passivation layer which covers the deterioration factor adsorptive and/or reactive layer to protect the first electrode, the photoelectric conversion layer and the second electrode.

14 Claims, 2 Drawing Sheets

PHOTOELECTRIC CONVERSION DEVICE AND SOLID-STATE IMAGING DEVICE

FIELD OF THE INVENTION

The present invention relates to a photoelectric conversion device including a first electrode (formed on a flat plane), a photoelectric conversion layer formed in an upper side of the first electrode, and a second electrode formed in an upper side of the photoelectric conversion layer.

BACKGROUND OF THE INVENTION

In CCD type or CMOS type solid-state imaging devices which are mounted in a digital still camera, a digital video camera, or the like, a technical evolution progresses close to the limits, and a size of an aperture of a single light receiving part comes close to a wavelength order of incident light as approximately 2 µm. For that reason, there is encountered a problem that the manufacturing yield is poor. Also, the quantity of light which a single light receiving part is able to detect is small so that the sensitivity is lowered. In addition, the upper limit of the quantity of photoelectric charges to be stored in a single minute light receiving part is a little as about 3,000 so that it becomes difficult to beautifully express 256 gradations. From these problems, in view of image quality and sensitivity, it is difficult to expect a tremendous improvement in performance of the related-art CCD type or CMOS type solid-state imaging devices.

In order to solve these problems, for example, as described in JP-A-58-103165 and JP-A-2002-83946, there is proposed a stack type solid-state imaging device in which only a signal read-out circuit is provided in a semiconductor substrate and an R detecting photoelectric conversion device having a red color (R) detecting photoelectric conversion layer interposed between electrodes, a G detecting photoelectric conversion device having a green color (G) detecting photoelectric conversion layer interposed between electrodes and a B detecting photoelectric conversion device having a blue color (B) detecting photoelectric conversion layer interposed between electrodes are stacked in an upper layer part of the semiconductor substrate.

SUMMARY OF THE INVENTION

In the foregoing stack type imaging devices, an organic material is preferably used as a material for constituting the photoelectric conversion layer because it is excellent in spectral characteristics and sensitivity. However, when an organic material is used as a material for constituting the photoelectric conversion layer, the organic material is easy to deteriorate due to a deterioration factor such as moisture and a gas (for example, oxygen). In a photoelectric conversion device having a photoelectric conversion layer which is constituted to contain an organic material, how to prevent the deterioration in performance of the device due to a deterioration factor is an important problem.

In view of the foregoing background, the invention has been made. An object of the invention is to provide a photoelectric conversion device capable of inhibiting deterioration in performance caused due to a deterioration factor and a solid-state imaging device.

(1) A photoelectric conversion device including a first electrode (formed on a flat plane), a photoelectric conversion layer formed in an upper side of the first electrode, and a second electrode formed in an upper side of the photoelectric conversion layer, which is provided with a deterioration factor adsorptive and/or reactive layer which is a layer for covering the first electrode, the photoelectric conversion layer and the second electrode and which has at least one of adsorptivity of adsorbing a deterioration factor and reactivity of reacting with the deterioration factor; and a passivation layer for covering the deterioration factor adsorptive and/or reactive layer to protect (passivate) the first electrode, the photoelectric conversion layer and the second electrode.

(2) The photoelectric conversion device as set forth in (1), wherein the deterioration factor adsorptive and/or reactive layer is constituted of a material capable of keeping a performance of the photoelectric conversion layer even after adsorption of the deterioration factor and reaction with the deterioration factor.

(3) The photoelectric conversion device as set forth in (1) or (2), wherein the deterioration factor adsorptive and/or reactive layer is constituted of an organic material.

(4) The photoelectric conversion device as set forth in (3), wherein when the deterioration factor adsorptive and/or reactive layer has only the reactivity, the organic material is an organic semiconductor.

(5) The photoelectric conversion device as set forth in (3) or (4), wherein the passivation layer is constituted of silicon nitride or silicon oxynitride.

(6) The photoelectric conversion device as set forth in (1) or (2), wherein when the deterioration factor adsorptive and/or or reactive layer has only the adsorptivity or both the adsorptivity and the reactivity, the deterioration factor adsorptive and/or reactive layer is constituted of an inorganic material.

(7) The photoelectric conversion device as set forth in (6), wherein the inorganic material is a metal oxide or a metal fluoride.

(8) The photoelectric conversion device as set forth in any one of (1) to (7), wherein the photoelectric conversion layer is constituted to contain an organic material.

(9) The photoelectric conversion device as set forth in any one of (1) to (8), wherein the material constituting the deterioration factor adsorptive and/or reactive layer is a material which is formable by a physical vapor deposition method.

(10) A solid-state imaging device, which is provided with at least one photoelectric conversion device as set forth in any one of (1) to (9) stacked in an upper side of a semiconductor substrate; and a signal read-out part for reading out a signal corresponding to a signal charge generated in the at least one photoelectric conversion device.

(11) The solid-state imaging device as set forth in (10), wherein a photodiode for detecting light which has transmitted through the at least one photoelectric conversion device is provided within the semiconductor substrate.

According to the invention, it is possible to provide a photoelectric conversion device capable of inhibiting deterioration in performance caused due to a deterioration factor and a solid-state imaging device.

DETAILED DESCRIPTION OF THE INVENTION

Embodiments of the invention are hereunder described with reference to the accompanying drawings.

First Embodiment

Figure 1:
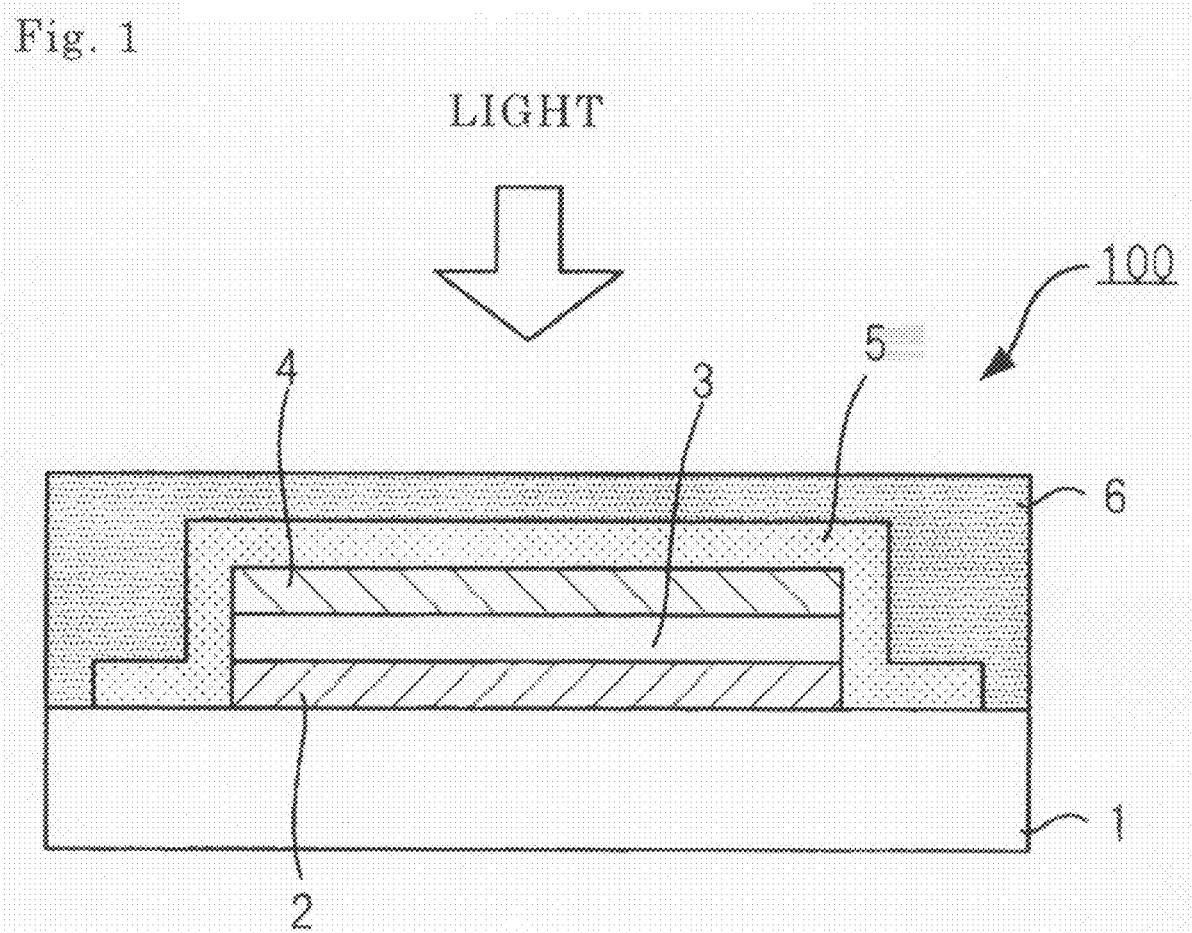
FIG. 1 is a sectional schematic view to show an outline configuration of a photoelectric conversion device for the purpose of explaining a first embodiment of the invention.

FIG. 1 is a sectional schematic view to show an outline configuration of a photoelectric conversion device for the purpose of explaining a first embodiment of the invention.

A photoelectric conversion device 100 as illustrated in FIG. 1 is provided with a deterioration factor adsorptive and/or reactive layer 5 which is a layer for covering a lower electrode 2 as a first electrode formed on a flat plane of a substrate 1 having a flat plane such as a glass substrate, a photoelectric conversion layer 3 formed on the lower electrode 2, an upper electrode 4 as a second electrode formed on the photoelectric conversion layer 3, and exposed surfaces of the lower electrode 2, the photoelectric conversion layer 3 and the upper electrode 4 and which has at least one of adsorptivity of adsorbing a deterioration factor such as moisture and oxygen and reactivity of reacting with the deterioration factor; and a passivation layer 6 for covering the deterioration factor adsorptive and/or reactive layer 5 to passivate the lower electrode 2, the photoelectric conversion layer 3 and the upper electrode 4.

In the embodiment of FIG. 1, light is made incident into the photoelectric conversion device 100 from a side of the upper electrode 4, and a charge is generated in the photoelectric conversion layer 3 corresponding to this light. By applying a voltage to the lower electrode 2 and the upper electrode 4, the charge generated in the photoelectric conversion layer 3 moves into the lower electrode 2 and the upper electrode 4; and a signal corresponding to the charge which has moved into either one of the lower electrode 2 or the upper electrode 4 is extracted outside.

The lower electrode 2 is an electrode for collecting the charge (for example, an electron) generated in the photoelectric conversion layer 3. In the case where at least one photoelectric conversion device 100 is stacked in an upper side of a semiconductor substrate to realize a stack type solid-state imaging device, it is preferable that the lower electrode 2 is transparent. It is meant by the term "transparent" as referred to in this specification that the electrode transmits 80% or more of visible light having a wavelength in the range of from about 420 nm to about 660 nm therethrough.

The upper electrode 4 is an electrode for collecting the charge (for example, a hole) generated in the photoelectric conversion layer 3. Since light is required to be made incident into the photoelectric conversion layer 3, it is preferable that the upper electrode 4 is transparent.

The photoelectric conversion layer 3 contains at least a photoelectric conversion site capable of absorbing light having a specified wavelength and generating a charge corresponding to the absorbed light. The photoelectric conversion site may be of any of a single-layered structure and a multi-layered structure. As a material constituting the photoelectric conversion site, though an inorganic material and an organic material can be used, it is especially preferred to use an organic material because it is excellent in spectral characteristics and sensitivity. The photoelectric conversion layer 3 may include, in addition to the photoelectric conversion site, a charge blocking layer for inhibiting the injection of a charge from the lower electrode 2 or the upper electrode 4 or the like.

The passivation layer 6 is constituted of a minute inorganic material.

The deterioration factor adsorptive and/or reactive layer 5 is constituted of a material capable of keeping a performance of the photoelectric conversion layer 3 even after adsorption of the deterioration factor and after reaction with the deterioration factor. Furthermore, it is preferable that a material having a low mutual action with the passivation layer 6 so that an internal stress is hardly transferred is used for the deterioration factor adsorptive and/or reactive layer 5. Moreover, since light is required to be made incident into the photoelectric conversion layer 3, it is preferable that the deterioration factor adsorptive and/or reactive layer 5 is transparent. As the material which meets the foregoing condition, the following organic materials and inorganic materials are enumerated. Examples of the organic material include high molecular substances such as polyvinyl alcohol; and organic semiconductors and metal complex compounds which are utilized as a photoelectric conversion material. Examples of the inorganic material include metal fluorides such as calcium fluoride, magnesium fluoride, and lithium fluoride; and metal oxides such as calcium oxide, silicon oxide, strontium oxide, barium oxide, and magnesium oxide.

Of the above-enumerated materials of the deterioration factor adsorptive and/or reactive layer 5, polyvinyl alcohol is enumerated as the organic material having only adsorptivity; and metal fluorides are enumerated as the inorganic material having only adsorptivity. Furthermore, organic semiconductors are enumerated as the organic material having only reactivity. Moreover, metal complex compounds are enumerated as the organic material having both reactivity and adsorptivity; and metal oxides are enumerated as the inorganic material having both reactivity and adsorptivity.

In the thus configured photoelectric conversion device 100, since the passivation layer 6 is formed to cover the lower electrode 2, the photoelectric conversion layer 3 and the upper electrode 4, it is possible to inhibit the deterioration of the lower electrode 2, the photoelectric conversion layer 3 and the upper electrode 4 caused due to the deterioration factor as compared with the case where the passivation layer 6 is not formed. However, in the case of a configuration in which only the passivation layer 6 is formed without providing the deterioration factor adsorptive and/or reactive layer 5, the following problems are caused.

(First Problem)

Even when the passivation layer 6 is fabricated directly on the upper electrode 4, defects (for example, a crack and a pinhole) of the passivation layer 6 per se caused due to dust generation at the manufacture of the passivation layer 6 are unavoidable. A deterioration factor such as water and oxygen penetrates from such a defective portion, thereby deteriorating the lower electrode 2, the photoelectric conversion layer 3 and the upper electrode 4.

(Second Problem)

Though a minute inorganic material such as silicon nitride and silicon oxynitride is utilized as the passivation layer 6, such an inorganic layer is large in internal stress. For that reason, especially in an end of the photoelectric conversion layer 3, the photoelectric conversion layer 3 is broken, the upper electrode 4 and the lower electrode come into partial contact with each other, thereby causing a short circuit.

In the photoelectric conversion device 100, by providing the deterioration factor adsorptive and/or reactive layer 5, even when the deterioration factor penetrates from a defect present in the passivation layer 6, since the deterioration factor which has penetrated is adsorbed by the deterioration factor adsorptive and/or reactive layer 5, it is possible to prevent the deterioration factor from arrival at the lower electrode 2, the photoelectric conversion layer 3 and the upper electrode 4. Furthermore, since the deterioration factor which has penetrated reacts with the deterioration factor adsorptive and/or reactive layer 5 and disappears, it is possible to prevent the deterioration factor from arrival at the lower electrode 2, the photoelectric conversion layer 3 and the upper electrode 4. Moreover, since the deterioration factor which has penetrated is adsorbed by the deterioration factor adsorptive and/or reactive layer 5 and reacts with the deterioration factor adsorptive and/or reactive layer, it is possible to prevent the deterioration factor from arrival at the lower electrode 2, the photoelectric conversion layer 3 and the upper electrode 4 and to inhibit deterioration of the device. As a result, the foregoing first problem can be solved.

In addition, when an organic material is used as the deterioration factor adsorptive and/or reactive layer 5, it is possible to reduce adhesion of the inorganic material constituting the passivation layer 6 to the organic material and to make an internal stress of the passivation layer 6 hardly transfer into the photoelectric conversion layer 3. As a result, the foregoing second problem can be solved. When silicon nitride or silicon oxynitride is used as the passivation layer 6, the adhesion between the deterioration factor adsorptive and/or reactive layer 5 and the passivation layer 6 can be especially made low, and therefore, such is effective.

As described above, the deterioration factor adsorptive and/or reactive layer 5 is able to inhibit arrival of the deterioration factor at the lower electrode 2, the photoelectric conversion layer 3 and the upper electrode 4. However, if a matter that the deterioration factor has penetrated into the lower electrode 2, the photoelectric conversion layer 3 and the upper layer 4 at the manufacture of the photoelectric conversion device 100 takes place, such is meaningless. For that reason, for the purpose of preventing the penetration of the deterioration factor at the manufacture of the photoelectric conversion device 100, it is preferable that the lower electrode 2, the photoelectric conversion layer 3, the upper electrode 4, the deterioration factor adsorptive and/or reactive layer 5 and the passivation layer 6 are formed in a vacuum integrated process. In order to manufacture the photoelectric conversion device 100 in a vacuum integrated process, among the foregoing materials, it is preferred to use, as the material of the deterioration factor adsorptive and/or reactive layer 5, a material capable of being fabricated by a physical vapor deposition method in which the lower electrode 2, the photoelectric conversion layer 3 and the upper electrode 4 can be consistently prepared, such as a vacuum vapor deposition method, a sputtering method, an ion plating method, and a molecular beam epitaxy method. Incidentally, taking into consideration an photoelectric conversion efficiency and an effect for inhibiting penetration of a deterioration factor, a thickness of the deterioration factor adsorptive and/or reactive layer 5 is preferably from 0.05 µm to 1 µm, and more preferably from 0.1 µm to 0.5 µm.

Specific embodiments of the foregoing lower electrode 2, photoelectric conversion layer 3, upper electrode 4 and passivation layer 6 are hereunder described.

(Photoelectric Conversion Layer)

The photoelectric conversion layer is formed by stacking or mixing a site for absorbing electromagnetic waves, a photoelectric conversion site, an electron transport site, a hole transport site, an electron blocking site, a hole blocking site, a crystallization preventing site, and so on. It is preferable that the photoelectric conversion layer contains an organic p-type semiconductor or an organic n-type semiconductor.

The organic p-type semiconductor (compound) is an organic semiconductor (compound) having donor properties and refers to an organic compound which is mainly represented by a hole transporting organic compound and which has properties such that it is liable to donate an electron. In more detail, the organic p-type semiconductor refers to an organic compound having a smaller ionization potential in two organic compounds when they are brought into contact with each other and used. Accordingly, with respect to the organic compound having donor properties, any organic compound can be used so far as it is an electron donating organic compound. Useful examples thereof include triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, fused aromatic carbocyclic compounds (for example, naphthalene derivatives, anthracene derivatives, phenanthrene derivatives, tetracene derivatives, pyrene derivatives, perylene derivatives, and fluoranthene derivatives), and metal complexes having, as a ligand, a nitrogen-containing heterocyclic compound. Incidentally, the invention is not limited to these compounds, and as described previously, an organic compound having a smaller ionization potential than that of an organic compound to be used as an n-type compound (having acceptor properties) may be used as the organic semiconductor having donor properties.

The organic n-type semiconductor (compound) is an organic semiconductor (compound) having acceptor properties and refers to an organic compound which is mainly represented by an electron transporting organic compound and which has properties such that it is liable to accept an electron. In more detail, the organic n-type semiconductor refers to an organic compound having a larger electron affinity in two organic compounds when they are brought into contact with each other and used. Accordingly, with respect to the organic compound having acceptor properties, any organic compound can be used so far as it is an electron accepting organic compound. Useful examples thereof include fused aromatic carbocyclic compounds (for example, naphthalene derivatives, anthracene derivatives, phenanthroline derivatives, tetracene deriveatives, pyrene derivatives, perylene derivatives, and fluoranthene derivatives), 5- to 7-membered heterocyclic compounds containing a nitrogen atom, an oxygen atom or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, and tribenzazepine) polyarylene compounds, fluorene compounds, cyclopentadiene compounds, silyl compounds, and metal complexes having, as a ligand, a nitrogen-containing heterocyclic compound. Incidentally, the invention is not limited to these compounds, and as described previously, an organic compound having a larger electron affinity than that of an organic compound to be used as an organic compound having donor properties may be used as the organic semiconductor having acceptor properties.

Though any organic dye is useful as the p-type organic dye or n-type organic dye, preferred examples thereof include cyanine dyes, styryl dyes, hemicyanine dyes, merocyanine dyes (inclusive of zeromethinemerocyanine (simple merocyanine)), trinuclear merocyanine dyes, tetranuclear merocyanine dyes, rhodacyanine dyes, complex cyanine dyes, complex merocyanine dyes, alopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugide dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes, metal complex dyes, and fused aromatic carbocyclic compounds (for example, naphthalene derivatives, anthracene derivatives, phenanthrene derivatives, tetracene derivatives, pyrene derivatives, perylene derivatives, and fluoranthene derivatives).

Next, the metal complex compound is described. The metal complex compound is a metal complex having a ligand containing at least one of a nitrogen atom, an oxygen atom and a sulfur atom coordinated to a metal. Though a metal ion in the metal complex is not particularly limited, it is preferably a beryllium ion, a magnesium ion, an aluminum ion, a gallium ion, a zinc ion, an indium ion, or a tin ion; more preferably a beryllium ion, an aluminum ion, a gallium ion, or a zinc ion; and further preferably an aluminum ion or a zinc ion. As the ligand which is contained in the metal complex, there are enumerated various known ligands. Examples thereof include ligands as described in H. Yersin, *Photochemistry and Photophysics of Coordination Compounds*, Springer-Verlag, 1987; and Akio Yamamoto, *Organometallic Chemistry-Principles and Applications*, Shokabo Publishing Co., Ltd., 1982.

The foregoing ligand is preferably a nitrogen-containing heterocyclic ligand (having preferably from 1 to 30 carbon atoms, more preferably from 2 to 20 carbon atoms, and especially preferably from 3 to 15 carbon atoms, which may be a monodentate ligand or a bidentate or polydentate ligand, with a bidentate ligand being preferable; and examples of which include a pyridine ligand, a bipyridyl ligand, a quinolinol ligand, and a hydroxyphenylazole ligand (for example, a hydroxyphenylbenzimidazole ligand, a hydroxyphenylbenzoxazole ligand, and a hydroxyphenylimidazole ligand)), an alkoxy ligand (having preferably from 1 to 30 carbon atoms, more preferably from 1 to 20 carbon atoms, and especially preferably from 1 to 10 carbon atoms, examples of which include methoxy, ethoxy, butoxy, and 2-ethylhexyloxy) an aryloxy ligand (having preferably from 6 to 30 carbon atoms, more preferably from 6 to 20 carbon atoms, and especially preferably from 6 to 12 carbon atoms, examples of which include phenyloxy, 1-naphthyloxy, 2-naphthyloxy, 2,4,6-trimethylphenyloxy, and 4-biphenyloxy), a heteroaryloxy ligand (having preferably from 1 to 30 carbon atoms, more preferably from 1 to 20 carbon atoms, and especially preferably from 1 to 12 carbon atoms, examples of which include pyridyloxy, pyrazyloxy, pyrimidyloxy, and quinolyloxy), an alkylthio ligand (having preferably from 1 to 30 carbon atoms, more preferably from 1 to 20 carbon atoms, and especially preferably from 1 to 12 carbon atoms, examples of which include methylthio and ethylthio), an arylthio ligand (having preferably from 6 to 30 carbon atoms, more preferably from 6 to 20 carbon atoms, and especially preferably from 6 to 12 carbon atoms, examples of which include phenylthio), a heterocyclic substituted thio ligand (having preferably from 1 to 30 carbon atoms, more preferably from 1 to 20 carbon atoms, and especially preferably from 1 to 12 carbon atoms, examples of which include pyridylthio, 2-benzimidazolylthio, 2-benzoxazolylthio, and 2-benzothiazolylthio), or a siloxy ligand (having preferably from 1 to 30 carbon atoms, more preferably from 3 to 25 carbon atoms, and especially preferably from 6 to 20 carbon atoms, examples of which include a triphenyloxy group, a triethoxysiloxy group, and a triisopropylsiloxy group); more preferably a nitrogen-containing heterocyclic ligand, an aryloxy ligand, a heteroaryloxy ligand, or a siloxy ligand; and further preferably a nitrogen-containing heterocyclic ligand, an aryloxy ligand, or a siloxy ligand.

The case where the photoelectric conversion layer has a p-type semiconductor layer and an n-type semiconductor layer between the lower electrode and the upper electrode, with at least one of the p-type semiconductor and the n-type semiconductor being an organic semiconductor, and a bulk heterojunction structure layer containing the p-type semiconductor and the n-type semiconductor as an interlayer between these semiconductor layers is preferable. By containing a bulk heterojunction structure, it is possible to compensate a drawback that the organic layer has a short carrier diffusion length and to improve the photoelectric conversion efficiency. Incidentally, the bulk heterojunction structure is described in detail in Japanese Patent Application No. 2004-080639.

Furthermore, the case where the photoelectric conversion layer has a structure having two or more of a repeating structure (tandem structure) of a pn junction layer formed of the p-type semiconductor layer and the n-type semiconductor layer between the lower electrode and the upper electrode is preferable; and the case where a thin layer made of a conducting material is inserted between the foregoing repeating structures is more preferable. The number of the repeating structure (tandem structure) of a pn junction layer is not limited. For the purpose of enhancing the photoelectric conversion efficiency, the number of the repeating structure of a pn junction layer is preferably from 2 to 50, more preferably from 2 to 30, and especially preferably from 2 to 10. The conducting material is preferably silver or gold, and most preferably silver. Incidentally, the tandem structure is described in detail in Japanese Patent Application No. 2004-079930.

In the photoelectric conversion layer having a layer of a p-type semiconductor and a layer of an n-type semiconductor (preferably a mixed or dispersed (bulk heterojunction structure) layer) between the lower electrode and the upper electrode, the case where an orientation-controlled organic compound is contained in at least one of the p-type semiconductor and the n-type semiconductor is preferable; and the case where an orientation-controlled (or orientation controllable) organic compound is contained in both the p-type semiconductor and the n-type semiconductor is more preferable. As this organic compound, an organic compound having a π-conjugated electron is preferably used. It is preferable that this π-electron plane is not vertical to a substrate (electrode substrate) but is oriented at an angle close to parallel to the substrate as far as possible. The angle against the substrate is preferably 0° or more and not more than 80°, more preferably 0° or more and not more than 60°, further preferably 0° or more and not more than 40°, still further preferably 0° or more and not more than 20°, especially preferably 0° or more and not more than 10°, and most preferably 0° (namely, in parallel to the substrate). As described previously, it is merely required that the layer of the orientation-controlled organic compound is contained in even a part of the organic layer against the whole thereof. A proportion of the orientation-controlled portion to the whole of the organic layer is preferably 10% or more, more preferably 30% or more, further preferably 50% or more, still further preferably 70% or more, especially preferably 90% or more, and most preferably 100%. In the photoelectric conversion layer, by controlling the orientation of the organic compound which is contained in the organic layer, the foregoing state compensates a drawback that the organic layer has a short carrier diffusion length, thereby improving the photoelectric conversion efficiency.

In the case where the orientation of an organic compound is controlled, it is more preferable that the heterojunction plane (for example, a pn junction plane) is not in parallel to a substrate. It is preferable that the heterojunction plane is not in parallel to the substrate (electrode substrate) but is oriented at an angle close to verticality to the substrate as far as possible. The angle to the substrate is preferably 10° or more and not more than 90°, more preferably 30 or more and not more than 90°, further preferably 50° or more and not more than 90°, still further preferably 70° or more and not more than 90°, especially preferably 80 or more and not more than 90°, and most preferably 90° (namely, vertical to the substrate). As described previously, it is merely required that the heterojunction plane-controlled organic compound is contained in even a part of the organic layer against the whole thereof. A proportion of the orientation-controlled portion to the whole of the organic layer is preferably 10% or more, more preferably 30% or more, further preferably 50% or more, still further preferably 70% or more, especially preferably 90% or more, and most preferably 100%. In such case, the area of the heterojunction plane in the organic layer increases and the amount of a carrier such as an electron, a hole and a pair of an electron and a hole as formed on the interface increases so that it is possible to improve the photoelectric conversion efficiency. In the light of the above, in the photoelectric conversion element in which the orientation of the organic compound on both the hetero-junction plane and the π-electron plane is controlled, it is possible to improve especially the photoelectric conversion efficiency. These states are described in detail in Japanese Patent Application No. 2004-079931. From the standpoint of optical absorption, it is preferable that the thickness of the organic dye layer is thick as far as possible. However, taking into consideration a proportion which does not contribute to the charge separation, the thickness of the organic dye layer is preferably 30 nm or more and not more than 300 nm, more preferably 50 nm or more and not more than 250 nm, and especially preferably 80 nm or more and not more than 200 nm.

(Formation Method of Organic Layer)

The layer containing such an organic compound is fabricated by a dry fabrication method or a wet fabrication method. Specific examples of the dry fabrication method include physical vapor deposition methods such as a vacuum vapor deposition method, a sputtering method, an ion plating method, and a molecular beam epitaxy method; and chemical vapor deposition methods such as plasma polymerization. Examples of the wet fabrication method include a coating method, a spin coating method, a dipping method, and an LB method.

In the case of using a high molecular weight compound in at least one of the p-type semiconductor (compound) and the n-type semiconductor (compound), it is preferable that the fabrication is achieved by a wet fabrication method which is easy for the preparation. In the case of employing a dry fabrication method such as vapor deposition, the use of a high molecular weight compound is difficult because of possible occurrence of decomposition. Accordingly, its oligomer can be preferably used as a replacement thereof. On the other hand, in the case of using a low molecular weight compound, a dry fabrication method is preferably employed, and a vacuum vapor deposition method is especially preferably employed. In the vacuum vapor deposition method, a method for heating a compound such as a resistance heating vapor deposition method and an electron beam heating vapor deposition method, the shape of a vapor deposition source such as a crucible and a boat, a degree of vacuum, a vapor deposition temperature, a substrate temperature, a vapor deposition rate, and the like are a basic parameter. In order to make it possible to achieve uniform vapor deposition, it is preferable that the vapor deposition is carried out while rotating the substrate. A high degree of vacuum is preferable. The vacuum vapor deposition is carried out at a degree of vacuum of not more than $10^{-2}$ Pa, preferably not more than $10^{-4}$ Pa, and especially preferably not more than $10^{-6}$ Pa. It is preferable that all steps at the vapor deposition are carried out in vacuo. Basically, the vacuum vapor fabrication is carried out in such a manner that the compound does not come into direct contact with the external oxygen and moisture. The foregoing conditions of the vacuum vapor deposition must be strictly controlled because they affect crystallinity, amorphous properties, density, compactness, and so on. It is preferably employed to subject the vapor deposition rate to PI or PID control using a layer thickness monitor such as a quartz oscillator and an interferometer. In the case of vapor depositing two or more kinds of compounds at the same time, a dual-source vapor deposition method, a flash vapor deposition method and so on can be preferably employed.

(Electrode)

It is preferable that a hole collecting electrode for collecting a hole extracts a hole from a hole transporting photoelectric conversion site or a hole transport site, and a material such as metals, alloys, metal oxides, electrically conducting compounds, and mixtures thereof can be used. It is preferable that an electron collecting electrode for collecting an electron extracts an electron from a photoelectric conversion site, and a material is selected while taking into consideration adhesion with an adjacent layer such as the photoelectric conversion site, electron affinity, ionization potential, stability, and the like. Specific examples of such a material include conducting metal oxides (for example, tin oxide, zinc oxide, indium oxide, indium zinc oxide (IZO), and indium tin oxide (ITO)); metals (for example, gold, silver, chromium, and nickel); mixtures or stacks of such a metal and such a conducting metal oxide; inorganic conducting substances (for example, copper iodide and copper sulfide); organic conducting materials (for example, polyaniline, polythiophene, and polypyrrole); silicon compounds; and stack materials thereof with ITO. Of these, conducting metal oxides are preferable; and ITO and IZO are especially preferable in view of productivity, high conductivity, transparency, and so on. Though the layer thickness can be properly selected depending upon the material, in general, it is preferably in the range of 10 nm or more and not more than 1 μm, more preferably 30 nm or more and not more than 500 nm, and further preferably 50 nm or more and not more than 300 nm.

In particular, in the case of application to a stacked stack type solid-state imaging device having the photoelectric conversion device stacked therein, it is preferable that both the upper electrode and the lower electrode are transparent. In addition, in order to inhibit a dark current, it is more preferable that the electron collecting electrode is of a structure in which a conducting metal oxide thin layer such as ITO is stacked on a metallic ultra-fine layer having a small work function, such as silver, indium and magnesium, in the side of the photoelectric conversion layer. Incidentally, the structure of this electron collecting electrode is described in detail in Japanese Patent Application No. 2005-251745.

In the preparation of the electrode, various methods are employable depending upon the material. For example, in the case of ITO, the layer is formed by a method such as an electron beam heating vapor deposition method, a sputtering method, a resistance heating vapor deposition method, a chemical reaction method (for example, a sol-gel method), and coating of an ITO dispersion. In the case of ITO, an ultraviolet light-ozone treatment, a plasma treatment, or the like can be applied.

It is preferable that the transparent electrode layer is prepared in a plasma-free state. By preparing the transparent electrode layer in a plasma-free state, it is possible to minimize influences of the plasma against the substrate and to make photoelectric conversion characteristics satisfactory. Here, the term "plasma-free state" means a state that plasma is not generated during the fabrication of the transparent electrode layer or that a distance from the plasma generation source to the substrate is 2 cm or more, preferably 10 cm or more, and more preferably 20 cm or more and that the plasma which reaches the substrate is reduced.

Examples of a device in which plasma is not generated during the fabrication of the transparent electrode layer include an electron beam heating vapor deposition device (EB vapor deposition device) and a pulse laser vapor deposition device. With respect to the EB vapor deposition device or pulse laser vapor deposition device, devices as described in *Developments of Transparent Conducting Films*, supervised by Yutaka Sawada (published by CMC Publishing Co., Ltd., 1999); *Developments of Transparent Conducting Films II*, supervised by Yutaka Sawada (published by CMC Publishing Co., Ltd., 2002); *Technologies of Transparent Conducting Films*, written by Japan Society for the Promotion of Science (published by Ohmsha, Ltd., 1999); and references as added therein can be used. In the following, the method for achieving deposition of a transparent electrode layer using an EB vapor fabrication device is referred to as "EB vapor deposition method"; and the method for achieving fabrication of a transparent electrode layer using a pulse laser vapor deposition device is referred to as "pulse laser vapor deposition method". With respect to the device capable of realizing the state that a distance from the plasma generation source to the substrate is 2 cm or more and that the plasma which reaches the substrate is reduced (hereinafter referred to as "plasma-free deposition device"), for example, a counter target type sputtering device and an arc plasma vapor deposition method can be thought. With respect to these matters, devices as described in *Developments of Transparent Conducting Films*, supervised by Yutaka Sawada (published by CMC Publishing Co., Ltd., 1999); *Developments of Transparent Conducting Films II*, supervised by Yutaka Sawada (published by CMC Publishing Co., Ltd., 2002); *Technologies of Transparent Conducting Films*, written by Japan Society for the Promotion of Science (published by Ohmsha, Ltd., 1999); and references as added therein can be used.

(Passivation Layer)

With respective to the condition which is required for the passivation layer, first of all, for the purpose of preparing the passivation layer in the side of the light receiving surface, the passivation layer must be transparent. Secondly, in the case of preparing a photoelectric conversion layer made of an organic material, the condition and measure must be selected such that the organic material already fabricated at the manufacture of the passivation layer is deteriorated. Thirdly, the photoelectric conversion layer must be passivated (protected) from heating, plasma, a solvent, or the like in the respective processes at the manufacture of the photoelectric conversion layer (process tolerance). Furthermore, after the manufacture, moisture, oxygen or the like is blocked, thereby preventing the deterioration of the organic material (preservability with time). Examples of a material which can meet these requirements include silicon compounds (for example, silicon nitride, silicon oxynitride, and silicon oxide); fluorocarbon resins (for example, polytetrafluoroethylene); and minute materials which neither water, oxygen, or the like neither penetrates into nor reacts with (for example, poly-p-xylene). In order to prevent incorporation of the deterioration factor such as water and oxygen at the manufacture of the photoelectric conversion device, fabrication of a passivation layer under a vacuum condition is preferable as a measure for preparing the passivation layer. As the method for preparing a minute passivation layer, a physical vapor deposition method (for example, an ion plating method and a sputtering method); a chemical vapor deposition method (for example, a plasma excitation chemical vapor deposition (plasma CVD) method and a catalyst chemical vapor deposition (catalyst CVD) method) can be preferably employed. A layer thickness of the passivation layer is preferably from 0.1 μm to 10 μm, more preferably from 0.5 μm to 5 μm, and further preferably from 1 μm to 3 μm.

By utilizing the thus configured photoelectric conversion device 100, it is possible to realize a stack type solid-state imaging device.

For example, as described in JP-A-58-103165 and JP-A-2002-83946, by stacking at least one photoelectric conversion device 100 in an upper side of a semiconductor substrate such as a silicon substrate and disposing a number of pixel parts in which a signal read-out part for reading out a signal corresponding to a charge generated in the at least one photoelectric conversion device 100 stacked in the upper side of the semiconductor substrate by a CCD or CMOS circuit or the like is formed on the semiconductor substrate in an array state, it is possible to realize a stack type solid-state imaging device. In the case of stacking one photoelectric conversion device 100, in place of the substrate 1 as illustrated in FIG. 1, such may be achieved by forming a flat dielectric layer on the semiconductor substrate and forming the photoelectric conversion device 100 on the flat plane of this dielectric layer. In the case of stacking plural photoelectric conversion devices 100, such may be achieved by forming a dielectric layer on the already formed photoelectric conversion device 100 and stacking a photoelectric conversion device 100 thereon. In the case of stacking plural photoelectric conversion devices 100, the dielectric layer present between the stacked photoelectric conversion devices 100 functions as a passivation layer of the photoelectric conversion device 100 present beneath the dielectric layer.

Furthermore, in the case of stacking one photoelectric conversion device 100 in an upper side of the semiconductor substrate, for example, by selecting a material capable of absorbing light in a G wavelength region as the material of the photoelectric conversion layer 3 of this photoelectric conversion device 100, it is possible to achieve monochromic photographing. Moreover, in the case of stacking three photoelectric conversion devices 100, by selecting a material capable of absorbing light in a G wavelength region, a material capable of absorbing light in an R wavelength region and a material capable of absorbing light in a B wavelength region as the materials of the respective photoelectric conversion layers 3 of the three photoelectric conversion devices 100, it is possible to achieve color photographing.

It is also possible to realize a solid-state imaging device in which a photodiode for detecting light which has transmitted through the stacked photoelectric conversion device 100 is formed within the semiconductor substrate having the photoelectric conversion device 100 stacked thereon. In that case, it is possible to realize a configuration in which one color is detected in an upper side of the semiconductor substrate and two colors are detected within the semiconductor substrate, thereby making it possible to achieve color photographing; a configuration in which two colors are detected in an upper side of the semiconductor substrate and one color is detected within the semiconductor substrate, thereby making it possible to achieve color photographing; or the like.

Configuration examples of the stack type solid-state imaging device are hereunder described. Hereinafter, a portion stacked in an upper side of the semiconductor substrate and performing photoelectric conversion is referred to as "organic layer"; a portion formed within the semiconductor substrate and performing photoelectric conversion is referred to as "inorganic layer", and the organic layer and the inorganic layer are collectively referred to as "photoelectric conversion part".

(Photoelectric Conversion Part)

The organic layer has a stack type structure of at least two layers capable of at least absorbing blue light, green light and red light, respectively and photoelectrically converting them. A blue light absorbing layer (B) is able to absorb at least light of from 400 to 500 nm and preferably has an absorption factor of a peak wavelength in the subject wavelength region of 50% or more. A green light absorbing layer (G) is able to absorb at least light of from 500 to 600 nm and preferably has an absorption factor of a peak wavelength in the subject wavelength region of 50% or more. A red light absorbing layer (R) is able to absorb at least light of from 600 to 700 nm and preferably has an absorption factor of a peak wavelength in the subject wavelength region of 50% or more. The order of these layers may be any order. In the case of a three-layer stack type structure, the order of BGR, BRG, GBR, GRB, RBG and RGB from the upper layer can be thought. It is preferable that the uppermost layer is a G layer. In the case of a two-layer stack type structure, when the upper layer is an R layer, the lower layer can be a combination of a B layer and a G layer formed in the same planar state; when the upper layer is a B layer, the lower layer can be a combination of a G layer and an R layer formed in the same planar state; and when the upper layer is a G layer, the lower layer can be a combination of a B layer and an R layer formed in the same planar state. A configuration in which the upper layer is a G layer and the lower layer is a combination of a B layer and an R layer formed in the same planar state is preferable. As described above, in the case where two light absorbing layers are provided in the same planar state of the lower layer, it is preferable that a filter layer capable of achieving color separation is provided in, for example, a mosaic state on the upper layer or between the upper layer and the lower layer. A fourth or succeeding layer may be provided as a new layer or in the same planar state as the case may be.

In the photoelectric conversion part, the organic layer may form B/G/R layers; and the inorganic layer may form B/G/R layers. A mixture of the organic layer and the inorganic layer is preferable. In that case, basically, when the organic layer is made of one layer, the inorganic layer is made of one layer or two layers; and when the organic layer is made of two layers, the inorganic layer is made of one layer. In the case of the organic layer and the inorganic layer are each made of one layer, a photoelectric conversion element in which the inorganic layer detects two or more colors in the same planar state is formed. It is preferable that the upper layer is made of an organic layer and is a G layer, whereas the lower layer is made of an inorganic layer and has the order of a B layer and an R layer from the upper side. A fourth or succeeding layer may be provided as a new layer or in the same planar state as the case may be. In the case where the organic layer forms B/G/R layers, a charge storage/transfer/read-out site is provided beneath them. In the case where an organic layer is used as the photoelectric conversion part, this inorganic layer also serves as the charge storage/transfer/read-out site.

The electrode which is used in the organic layer is described in more detail. The organic photoelectric conversion layer is interposed between a pixel electrode layer (lower electrode) and a counter electrode layer (upper electrode). The "pixel electrode layer" as referred to herein means an electrode layer prepared in an upper side of the substrate having the charge storage/transfer/read-out site formed therein and is usually divided for every pixel. This is made for the purpose of obtaining an image by reading out a signal charge converted by the photoelectric conversion layer onto a charge storage/transfer/read-out circuit substrate for every one pixel.

The "counter electrode layer" as referred to herein has a function to discharge a signal charge having a reversed polarity to a signal charge by interposing the photoelectric conversion layer together with the pixel electrode layer. Since this discharge of a signal charge is not required to be divided among the respective pixels, the counter electrode layer can be usually made common among the respective pixels. For that reason, the counter electrode layer is sometimes called a common electrode layer. The photoelectric conversion layer is positioned between the pixel electrode layer and the counter electrode layer. The photoelectric conversion function is made to function by this photoelectric conversion layer and the pixel electrode layer and the counter electrode layer.

As configuration examples of the photoelectric conversion layer stack, first of all, in the case where one organic layer is stacked on a substrate, there is enumerated a configuration in which a pixel electrode layer (basically a transparent electrode layer), a photoelectric conversion layer and a counter electrode layer (transparent electrode layer) are stacked in this order from the substrate. However, it should not be construed that the invention is limited thereto. In addition, in the case where two organic layers are stacked on a substrate, there is enumerated a configuration in which a pixel electrode layer (basically a transparent electrode layer), a photoelectric conversion layer, a counter electrode layer (transparent electrode layer), an interlaminar dielectric layer, a pixel electrode layer (basically a transparent electrode layer), a photoelectric conversion layer, and a counter electrode layer (transparent electrode layer) are stacked in this order from the substrate.

As the material of the transparent electrode layers for configuring the photoelectric conversion element therebetween, materials which can be fabricated by a plasma-free fabrication device, EB vapor deposition device or pulse laser vapor deposition device are preferable. For example, metals, alloys, metal oxides, metal nitrides, metallic borides, organic conducting compounds, and mixtures thereof can be suitably enumerated. Specific examples thereof include conducting metal oxides such as tin oxide, zinc oxide, indium oxide, ITO, IZO, and indium tungsten oxide (IWO); metal nitrides such as titanium nitride; metals such as gold, platinum, silver, chromium, nickel, and aluminum; mixtures or stacks of such a metal and such a conducting metal oxide; inorganic conducting substances such as copper iodide and copper sulfide; organic conducting materials such as polyaniline, polythiophene, and polypyrrole; and stacks thereof with ITO. Also, materials as described in detail in *Developments of Transparent Conducting Films*, supervised by Yutaka Sawada (published by CMC Publishing Co., Ltd., 1999); *Developments of Transparent Conducting Films II*, supervised by Yutaka Sawada (published by CMC Publishing Co., Ltd., 2002); *Technologies of Transparent Conducting Films*, written by Japan Society for the Promotion of Science (published by Ohmsha, Ltd., 1999); and references as added therein may be used.

As the material of the transparent electrode layer, any one of materials of ITO, IZO, tin oxide, antimony-doped tin oxide (ATO), fluorine-doped tin oxide (FTO), zinc oxide, aluminum-doped zinc oxide (AZO), gallium-doped zinc oxide (GZO), and titanium oxide is especially preferable. A light transmittance of the transparent electrode layer is preferably 60% or more, more preferably 80% or more, further preferably 90% or more, and still further preferably 95% or more at a photoelectric conversion light absorption peak wavelength of the photoelectric conversion layer to be contained in a photoelectric conversion device containing the subject transparent electrode layer. Furthermore, with respect to a surface resistance of the transparent electrode layer, its preferred range varies depending upon whether the transparent electrode layer is a pixel electrode or a counter electrode, whether the charge storage/transfer/read-out site is of a CCD structure or a CMOS structure, and the like. In the case where the transparent electrode layer is used for a counter electrode and the charge storage/transfer/read-out site is of a CMOS structure, the surface resistance is preferably not more than 10,000Ω/□ (Ω/square), and more preferably not more than 1,000Ω/□. In the case where the transparent electrode layer is used for a counter electrode and the charge storage/transfer/read-out site is of a CCD structure, the surface resistance is preferably not more than 1,000Ω/□, and more preferably not more than 100Ω/□. In the case where the transparent electrode layer is used for a pixel electrode, the surface resistance is preferably not more than 1,000,000Ω/□, and more preferably not more than 100,000Ω/□.

Conditions at the fabrication of a transparent electrode layer are hereunder mentioned. A substrate temperature at the fabrication of a transparent electrode layer is preferably not higher than 500° C., more preferably not higher than 300° C., further preferably not higher than 200° C., and still further preferably not higher than 150° C. Furthermore, a gas may be introduced during the fabrication of a transparent electrode layer. Basically, though the gas species is not limited, argon, helium, oxygen, nitrogen, and so on can be used. Furthermore, a mixed gas of such gases may be used. In particular, in the case of an oxide material, since oxygen deficiency often occurs, it is preferred to use oxygen.

The case of applying a voltage to the photoelectric conversion layer is preferable in view of improving the photoelectric conversion efficiency. Though any voltage is employable as the voltage to be applied, a necessary voltage varies with the layer thickness of the photoelectric conversion layer. That is, the larger an electric field to be added in the photo-electric conversion layer, the more improved the photoelectric conversion efficiency is. However, even when the same voltage is applied, the thinner the layer thickness of the photoelectric conversion layer, the larger an electric field to be applied is. Accordingly, in the case where the layer thickness of the photoelectric conversion layer is thin, the voltage to be applied may be relatively small. The electric field to be applied to the photoelectric conversion layer is preferably 10 V/m or more, more preferably $1 \times 10^3$ V/m or more, further preferably $1 \times 10^5$ V/m or more, especially preferably $1 \times 10^6$ V/m or more, and most preferably $1 \times 10^7$ V/m or more. Though there is no particular upper limit, when the electric field is excessively applied, an electric current flows even in a dark place and therefore, such is not preferable. The electric field is preferably not more than $1 \times 10^{12}$ V/m, and more preferably not more than $1 \times 10^9$ V/m.

(Inorganic Layer)

An inorganic layer is hereunder described. In that case, light which has passed through the organic layer as the upper layer is photoelectrically converted in the inorganic layer. With respect to the inorganic layer, pn junction or pin junction of crystalline silicon, amorphous silicon, or a chemical semiconductor such as gallium arsenide is generally employed. With respect to the stack type structure, a method as disclosed in U.S. Pat. No. 5,965,875 can be employed. That is, a configuration in which a light receiving part stacked by utilizing wavelength dependency of a coefficient of absorption of silicon is formed and color separation is carried out in a depth direction thereof. In that case, since the color separation is carried out with a light penetration depth of silicon, a spectrum range which is detected in each of the stacked light receiving parts becomes broad. However, by using the foregoing organic layer as the upper layer, namely by detecting the light which has transmitted through the organic layer in the depth direction of silicon, the color separation is remarkably improved. In particular, when a G layer is disposed in the organic layer, since light which has transmitted through the organic layer is blue light and red light, only the blue light and the red light are the subject to separation of light in the depth direction in silicon so that the color separation is improved. Even in the case where the organic layer is a B layer or an R layer, by properly selecting the photoelectric conversion site of silicon in the depth direction, the color separation is remarkably improved. In the case where the organic layer is made of two layers, the function as the photoelectric conversion site of silicon may be brought for only one color, and preferred color separation can be achieved.

The inorganic layer preferably has a structure in which plural photodiodes are superposed for every pixel in a depth direction within the semiconductor substrate and a color signal corresponding to a signal charge as generated in each of the photodiodes by light to be absorbed in the plural photodiodes is read out into the external. It is preferable that the plural photodiodes contain a first photodiode provided in the depth for absorbing blue light and at least one second photodiode provided in the depth for absorbing red light and are provided with a color signal read-out circuit for reading out a color signal corresponding to the foregoing signal charge generated in each of the foregoing plural photodiodes. According to this configuration, it is possible to carry out color separation without using a color filter. Furthermore, according to circumstances, since light of a negative sensitive component can also be received, it becomes possible to realize color imaging with good color reproducibility. Moreover, in the invention, it is preferable that a junction part of the foregoing first photodiode is formed in a depth of up to about 0.2 μm from the semiconductor substrate surface and that a junction part of the foregoing second photodiode is formed in a depth of up to about 2 μm from the semiconductor substrate surface.

The inorganic layer is hereunder described in more detail. Preferred examples of the configuration of the inorganic layer include light receiving devices of a photoconductive type, a p-n junction type, a shotkey junction type, a pin junction type, or an MSM (metal-semiconductor-metal) type; and light receiving devices of a phototransistor type. In the invention, it is preferred to use a light receiving device in which a plural number of a first conducting type region and a second conducting type region which is a reversed conducting type to the first conducting type are alternately stacked within a single semiconductor substrate and each of the junction planes of the first conducting type and the second conducting type regions is formed in a depth suitable for photoelectrically converting mainly plural lights of a different wavelength region. The single semiconductor substrate is preferably mono-crystalline silicon, and the color separation can be carried out by utilizing absorption wavelength characteristics relying upon the depth direction of the silicon substrate.

As the inorganic semiconductor, InGaN based, InAlN based, InAlP based, or InGaAlP based inorganic semiconductors can also be used. The InGaN based inorganic semiconductor is an inorganic semiconductor adjusted so as to have a maximum absorption value within a blue wavelength range by properly changing the In-containing composition. That is, the composition becomes $In_xGa_{1-x}N$ ($0 \leq x<1$). Such a compound semiconductor is manufactured by employing a metal organic chemical vapor deposition method (MOCVD method). With respect to the InAlN based nitride semi-conductor using, as a raw material, Al of the Group 13 similar to Ga, it can be used as a short wavelength light receiving part similar to the InGaN based semiconductor. Furthermore, InAlP or InGaAlP lattice-matching with a GaAs substrate can also be used.

The inorganic semiconductor may be of a buried structure. The "buried structure" as referred to herein refers to a configuration in which the both ends of a short wavelength light receiving part are covered by a semiconductor different from the short wavelength light receiving part. The semiconductor for covering the both ends is preferably a semiconductor having a band gap wavelength shorter than or equal to a hand gap wavelength of the short wavelength light receiving part. The organic layer and the inorganic layer may be bound to each other in any form. Furthermore, for the purpose of electrically insulating the organic layer and the inorganic layer from each other, it is preferred to provide a dielectric layer therebetween.

With respect to the junction, npn junction or pnpn junction from the light incident side is preferable. In particular, the pnpn junction is more preferable because by providing a p layer on the surface and increasing a potential of the surface, it is possible to trap a hole as generated in the vicinity of the surface and a dark current and reduce the dark current.

In such a photodiode, when an n-type layer, a p-type layer, an n-type layer and a p-type layer which are successively diffused from the p-type silicon substrate surface are deeply formed in this order, the pn-junction diode is formed of four layers of pnpn in a depth direction of silicon. With respect to the light which has come into the diode from the surface side, the longer the wavelength, the deeper the light penetration is. Also, the incident wavelength and the attenuation coefficient are inherent to silicon. Accordingly, the photodiode is designed such that the depth of the pn junction plane covers respective wavelength bands of visible light. Similarly, a junction diode of three layers of npn is obtained by forming an n-type layer, a p-type layer and n-type layer in this order. Here, a light signal is extracted from the n-type layer, and the p-type layer is grounded.

Furthermore, when an extraction electrode is provided in each region and a prescribed reset potential is applied, each region is depleted, and the capacity of each junction part becomes small unlimitedly. In this way, it is possible to make the capacity generated on the junction plane extremely small.

(Auxiliary Layer)

It is preferred to provide an ultraviolet light absorption layer and/or an infrared light absorption layer as an uppermost layer of the photoelectric conversion layer. The ultraviolet light absorption layer is able to at least absorb or reflect light of not more than 400 nm and preferably has an absorption factor of 50% or more in a wavelength region of not more than 400 nm. The infrared light absorption layer is able to at least absorb or reflect light of 700 nm or more and preferably has an absorption factor of 50% or more in a wavelength region of 700 nm or more.

Such an ultraviolet light absorption layer or infrared light absorption layer can be formed by a conventionally known method. For example, there is known a method in which a mordant layer made of a hydrophilic high molecular substance such as gelatin, casein, glue, and polyvinyl alcohol is provided on a substrate and a dye having a desired absorption wavelength is added to or dyes the mordant layer to form a colored layer. In addition, there is known a method of using a colored resin resulting from dispersing a certain kind of coloring material in a transparent resin. For example, it is possible to use a colored resin layer resulting from mixing a coloring material in a polyamino based resin as described in JP-A-58-46325, JP-A-60-78401, JP-A-60-184202, JP-A-60-184203, JP-A-60-184204, and JP-A-60-184205. A coloring agent using a polyamide resin having photo-sensitivity can also be used.

It is also possible to disperse a coloring material in an aromatic polyamide resin containing a photosensitive group in the molecule thereof and capable of obtaining a cured layer at not higher than 200° C. as described in JP-B-7-113685 and to use a colored resin having a pigment dispersed therein as described in JP-B-7-69486. A dielectric multilayered layer is preferably used. The dielectric multilayered layer has sharp wavelength dependency of light transmission and is preferably used.

It is preferable that the respective photoelectric conversion layers are separated by a dielectric layer. The dielectric layer can be formed by using a transparent dielectric material such as glass, polyethylene, polyethylene terephthalate, polyethersulfone, and polypropylene. Silicon nitride, silicon oxide, and the like are also preferably used. Silicon nitride prepared by fabrication by a plasma CVD method is preferably used in the invention because it is high in compactness and good in transparency. In addition, light collecting efficiency can be improved by forming a microlens array in the upper side of a light receiving device, and therefore, such an embodiment is preferable, too.

(Charge Storage/Transfer/Read-out Site)

As to the charge storage/transfer/read-out site, JP-A-58-103166, JP-A-58-103165, JP-A-2003-332551, and so on can be made hereof by reference. A configuration in which an MOS transistor is formed on a semiconductor substrate for every pixel unit or a configuration having CCD as a device can be properly employed. For example, in the case of a stack type solid-state imaging device using an MOS transistor, a charge is generated in a photoelectric conversion layer by incident light which has transmitted through electrodes; the charge runs to the electrodes within the photoelectric conversion layer by an electric field as generated between the electrodes by applying a voltage to the electrodes; and the charge is further transferred to a charge storage part of the MOS transistor and stored in the charge storage part. The charge stored in the charge storage part is transferred to a charge read-out part by switching of the MOS transistor and further outputted as an electric signal. In this way, full-color image signals are obtained. The signal charge can be read out by injecting a fixed amount of a bias charge into the storage diode (refresh mode) and then storing a fixed amount of the charge (photoelectric conversion mode). The light receiving device itself can be used as the storage diode, or a storage diode can be separately provided.

The read-out of the signal is hereunder described in more detail. The read-out of the signal can be carried out by using a usual color read-out circuit. A signal charge or a signal current which is subjected to light/electric conversion in the light receiving part is stored in the light receiving part itself or a capacitor as provided. The stored charge is subjected to selection of a pixel position and read-out by a measure of an MOS type imaging device (so-called CMOS sensor) using an X-Y address system. Besides, as an address selection system, there is enumerated a system in which every pixel is successively selected by a multiplexer switch and a digital shift register and read out as a signal voltage (or a charge) on a common output line. An imaging device of a two-dimensionally arrayed X-Y address operation is known as a CMOS sensor. In this imaging device, a switch provided in a pixel connected to an X-Y intersection point is connected to a vertical shift register, and when the switch is turned on by a voltage from the vertical scanning shift register, signals as read out from pixels as provided in the same line is read out on the output line in a column direction. The signals are successively read out from an output end through the switch to be driven by a horizontal scanning shift register.

For reading out the output signals, a floating diffusion detector or a floating gate detector can be used. Furthermore, it is possible to seek improvements of S/N by a measure such as provision of a signal amplification circuit in the pixel portion and correlated double sampling.

For the signal processing, gamma correction by an ADC circuit, digitalization by an AD transducer, luminance signal processing, and color signal processing can be applied. Examples of the color signal processing include white balance processing, color separation processing, and color matrix processing. In using for an NTSC signal, an RGB signal can be subjected to conversion processing of a YIQ signal.

The charge transfer/read-out site must have a mobility of charge of 100 $cm^2/V/sec$ or more. This mobility can be obtained by selecting the material among semiconductors of the IV group, the III-V group or the II-VI group. Above all, silicon semiconductors are preferable because of advancement of microstructure refinement technology and low costs. As to the charge transfer/charge read-out system, there are made a number of proposals, and all of them are employable. Above all, a COMS type device or a CCD type device is an especially preferred system. In addition, in many occasions, the CMOS type device is preferable in view of high-speed read-out, pixel addition, partial read-out, consumed electricity, and the like.

(Connection)

Though plural contact sites for connecting the electrodes for interposing the photoelectric conversion layer therebetween to the charge transfer/read-out site may be connected by any metal, a metal selected among copper, aluminum, silver, gold, chromium and tungsten is preferable, and copper is especially preferable. In response to the plural photoelectric conversion layers, each of the contact sites must be placed between the charge transfer/read-out sites. In the case of employing a stacked structure of plural photosensitive units of blue, green and red lights, a blue light extraction electrode and the charge transfer/read-out site, a green light extraction electrode and the charge transfer/read-out site, and a red light extraction electrode and the charge transfer/read-out site must be connected, respectively.

(Process)

The stack type solid-state imaging device can be manufactured according to a so-called known microfabrication process which is employed in manufacturing integrated circuits and the like. Basically, this process is concerned with a repeated operation of pattern exposure with active light, electron beams, etc. (for example, i- or g-bright line of mercury, excimer laser, X-rays, and electron beams) pattern formation by development and/or burning, alignment of device forming materials (for example, coating, vapor deposition, sputtering, and CV), and removal of the materials in a non-pattern area (for example, heat treatment and dissolution treatment).

(Utility)

A chip size of the device can be selected among a brownie size, a 135 size, an APS size, a $\frac{1}{1.8}$-inch size, and a smaller size. A pixel size of the stacked photoelectric conversion device of the invention is expressed by a circle-corresponding diameter which is corresponding to a maximum area in the plural electromagnetic absorption/photoelectric conversion sites. Though the pixel size is not limited, it is preferably from 2 to 20 microns, more preferably from 2 to 10 microns, and especially preferably from 3 to 8 microns. When the pixel size exceeds 20 microns, a resolving power is lowered, whereas when the pixel size is smaller than 2 microns, the resolving power is also lowered due to radio interference between the sizes.

The stack type solid-state imaging device can be utilized for a digital still camera. Also, it is preferable that the photoelectric conversion device of the invention is used for a TV camera. Besides, the stack type solid-state imaging device can be utilized for a digital video camera, a monitor camera (in, for example, office buildings, parking lots, unmanned loan-application systems in financial institution, shopping centers, convenience stores, outlet malls, department stores, pachinko parlors, karaoke boxes, game centers, and hospitals), other various sensors (for example, TV door intercoms, individual authentication sensors, sensors for factory automation, robots for household use, industrial robots, and piping examination systems), medical sensors (for example, endoscopes and fundus cameras), videoconference systems, television telephones, camera-equipped mobile phones, automobile safety running systems (for example, back guide monitors, collision prediction systems, and lane-keeping systems), and sensors for video game.

Above all, the stack type solid-state imaging device is suitable for use of a television camera. The reason for this resides in the matter that since it does not require a color decomposition optical system, it is able to achieve miniaturization and weight reduction of the television camera. Furthermore, since the stack type solid-state imaging device has high sensitivity and high resolving power, it is especially preferable for a television camera for high-definition broadcast. In that case, the term "television camera for high-definition broadcast" as referred to herein includes a camera for digital high-definition broadcast. In addition, the stack type solid-state imaging device is preferable because an optical low pass filter can be omitted and higher sensitivity and higher resolving power can be expected. In addition, in the stack type solid-state imaging device, not only the thickness can be made thin, but also a color decomposition optical system is not required. Therefore, with respect to shooting scenes in which a different sensitivity is required, such as "circumstances with a different brightness such as daytime and nighttime" and "immobile subject and mobile subject" and other shooting scenes in which requirements for spectral sensitivity or color reproducibility differ, various needs for shooting can be satisfied by one camera by exchanging the stack type solid-stage imaging device and performing shooting. At the same time, it is not required to carry plural cameras. Thus, a load of a person who wishes to take a shot is reduced. As a stack type solid-state imaging device which is the subject to the exchange, in addition to the foregoing, exchangeable photoelectric conversion devices for purposes of infrared light shooting, black-and-white shooting, and change of a dynamic range can be prepared.

Figure 2:
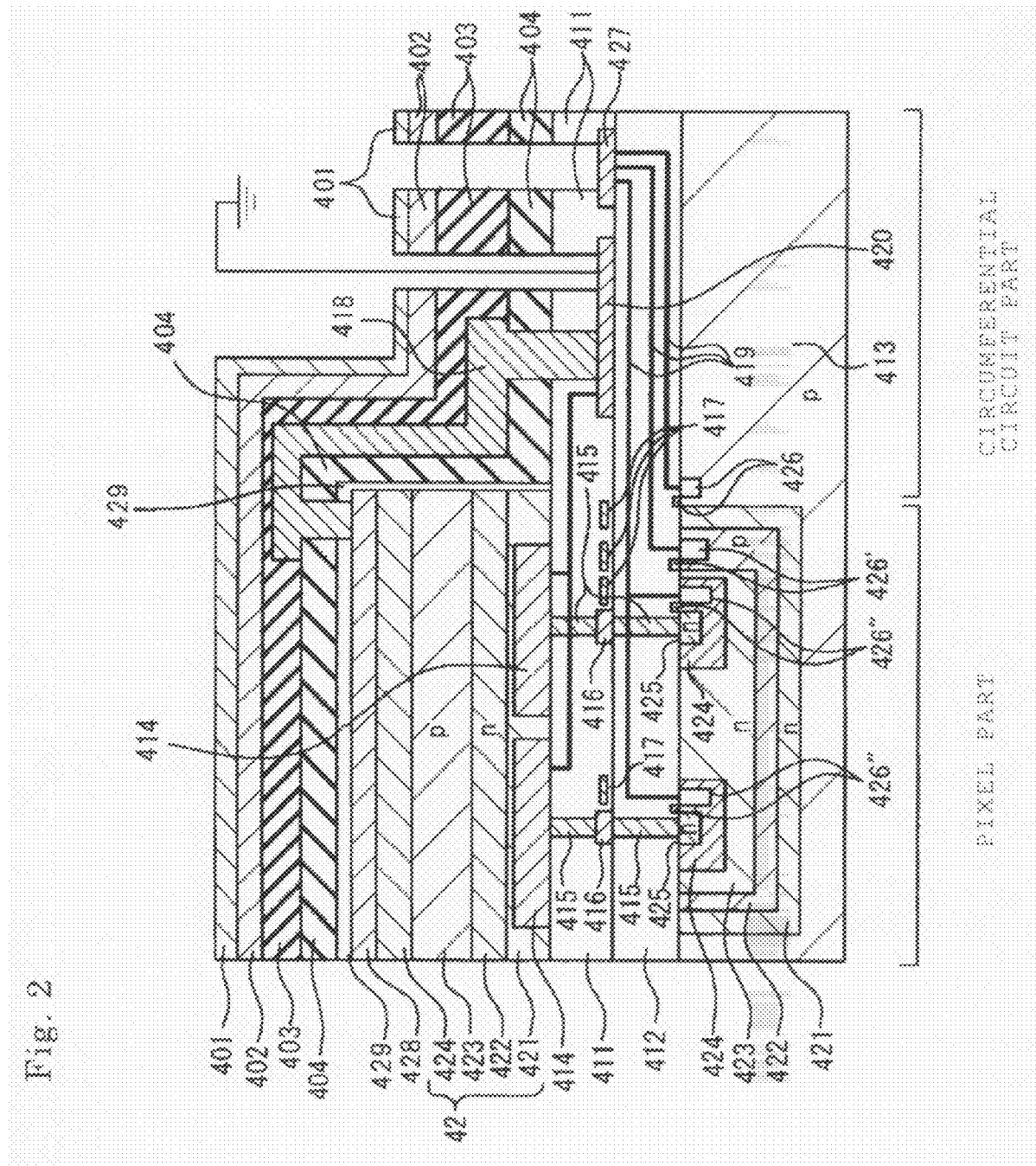
FIG. 2 is a partial sectional schematic view of a stack type solid-state imaging device for the purpose of explaining a second embodiment of the invention.

The TV camera can be prepared by referring to a description in Chapter 2 of *Design Technologies of Television Camera*, edited by the Institute of Image Information and Television Engineers (Aug. 20, 1999, published by Corona Publishing Co., Ltd.) and, for example, replacing a color decomposition optical system and an imaging device as a basic construction of a television camera as shown in FIG. 2.1 thereof by the foregoing stack type solid-state imaging device. By aligning the foregoing photoelectric conversion device, it can be utilized not only as an imaging device but also as an optical sensor such as biosensors and chemical sensors or a color light receiving device in a single body.

Second Embodiment

In the present embodiment, one embodiment of a stack type solid-stage imaging device using the photoelectric conversion device described in the first embodiment is described.

FIG. 2 is a partial sectional schematic view of a stack type solid-state imaging device for the purpose of explaining a second embodiment of the invention.

FIG. 2 illustrates a cross section of a portion of two pixels in a pixel part which is a portion for detecting light and storing a charge along with a wiring which is connected to electrodes as located in the pixel part and a cross section of a circumferential circuit part which is a portion where a bonding pad or the like is connected to the wiring.

In a p-type silicon substrate 413 of a pixel part, an n region 421 is formed in a surface part thereof; a p region 422 is formed in a surface part of the n region 421; an n region 423 is formed in a surface part of the p region 422; and a p region 424 is formed in a surface part of the n region 423.

The n region 421 stores an electron of a red (R) component which has been photoelectrically converted by the pn junction with the p-type silicon substrate 413. A potential change of the n region 421 caused due to the storage of the electron of the R component is read out into a signal read-out PAD 427 from an MOS transistor 426 formed in the p-type silicon substrate 413 via a metallic wiring 419 connected thereto.

The n region 423 stores an electron of a blue (B) component which has been photoelectrically converted by the pn junction with the p region 422. A potential change of the n region 423 caused due to the storage of the electron of the B component is read out into the signal read-out PAD 427 from an MOS transistor 426' formed in the p region 422 via the metallic wiring 419 connected thereto.

An electron storage region 425 which is made of an n region for storing an electron of a green (G) component generated in the photoelectric conversion sites 422 and 423 stacked in an upper side of the p-type silicon substrate 413 is formed within the p region 424. A potential change of the electron storage region 425 caused due to the storage of the electron of the G component is read out into the signal read-out PAD 427 from an MOS transistor 426" formed within the p region 424 via the metallic wiring 419 connected thereto. Usually, the signal read-out pad 427 is separately provided in every transistor from which each of the color components is read out.

Here, the n region, the p region, the transistor, the metallic wiring, and the like are schematically illustrated. However, the respective structures and the like are not limited thereto, and optimum structures are properly selected. Since the B light and the R light are distinguished from each other depending upon the depth of the silicon substrate, it is important to select the depth of the pn junction, etc. from the surface of the silicon substrate and the doping concentration of each of impurities.

A transparent dielectric layer 412 containing, as a major component, silicon oxide, silicon nitride, etc. is formed on the p-type silicon substrate 413; and a transparent dielectric layer 411 containing, as a major component, silicon oxide, silicon nitride, etc. is formed on the dielectric layer 412. It is preferable that the layer thickness of the dielectric layer 412 is thin as far as possible. The layer thickness of the dielectric layer 412 is preferably not more than 5 µm, more preferably not more than 3 µm, further preferably not more than 2 µm, and still further preferably not more than 1 µm.

A plug 415 for electrically connecting a lower electrode layer 414 to an n region 425 as the electron storage region, which contains, for example, tungsten as a major component, is formed within the dielectric layers 411 and 412; and the plug 415 is relayed and connected between the dielectric layer 411 and the dielectric layer 412 by a pad 416. As the pad 416, a substance containing aluminum as a major component is preferably used. The foregoing metallic wiring 419 and gate electrodes of the transistors 426, 426' and 426", and so on are formed within the dielectric layer 412. It is preferable that a barrier layer including the metallic wiring is provided. The plug 415 is provided in every pixel.

In order to prevent a noise caused due to the generation of a charge by the pn junction between the p region 424 and the n region 425, a light-shielding layer 417 is provided within the dielectric layer 411. As the light-shielding layer 417, a substance containing, as a major component, aluminum, tungsten, etc. is usually used. A bonding pad 420 (pad for supplying a power source from the outside) and the signal read-out pad 427 are formed within the dielectric layer 411.

The transparent lower electrode layer 414 is formed on the plug 415 of each pixel within the dielectric layer 411. The lower electrode layer 414 is divided for every pixel, and a light receiving area is determined by the size thereof. A photoelectric conversion layer 42 is formed on the lower electrode 414, and the upper electrode 428 is formed thereon. A bias is applied to the upper electrode 428 through a wiring from the bonding pad 420.

The photoelectric conversion element 42 is configured such that a hole blocking layer 421, a photoelectric conversion site 422 made of an n-type organic semiconductor, a photoelectric conversion site 423 made of a p-type organic semiconductor, and an electron blocking layer 424 are stacked in this order on the lower electrode 414. It is merely required that the photoelectric conversion layer 42 contains at least the photoelectric conversion sites 422 and 423 of these layers. A thickness of the photoelectric conversion element 42 is not more than 0.5 µm, more preferably not more than 0.3 µm, and especially preferably not more than 0.2 µm. A thickness of each of the lower electrode 414 and the upper electrode 428 is preferably not more than 0.2 μm.

In the configuration of FIG. 2, a material capable of absorbing green light to generate an electron and a hole corresponding thereto is used for the photoelectric conversion sites 422 and 423. Since the photoelectric conversion layer 42 can be commonly used in all pixels, so far as it is a layer having a single sheet configuration, it is not required that the photoelectric conversion layer 42 is separated for every pixel.

As the organic p-type semiconductor and the organic n-type semiconductor which constitute the photoelectric conversion sites 422 and 423, all of quinacridone derivatives, naphthalene derivatives, anthracene derivatives, phenanthrene derivatives, tetracene derivatives, pyrene derivatives, perylene derivatives, and fluoranthene derivatives can be especially preferably used.

In the stack type solid-state imaging device of FIG. 2, a voltage is applied to the lower electrode 414 and the upper electrode 428 such that the upper electrode 428 works as an electrode in the light incident side; a hole generated in the photoelectric conversion layer 42 moves into the upper electrode 428; and an electron generated in the photoelectric conversion element 42 moves into the lower electrode 414.

The hole blocking layer 421 is provided for the purpose of reducing a dark current caused due to the injection of a hole from the lower electrode 414 at the application of a voltage to the lower electrode 414 and the upper electrode 428, thereby inhibiting the injection of a hole from the lower electrode 414 into the photoelectric conversion sites 422 and 423.

The electron blocking layer 424 is provided for the purpose of reducing a dark current caused due to the injection of an electron from the upper electrode 428 at the application of a voltage to the lower electrode 414 and the upper electrode 428, thereby inhibiting the injection of an electron from the lower electrode 414 into the photoelectric conversion sites 422 and 423.

In the surroundings of the lower electrode 414, the photoelectric conversion layer 42 and the upper electrode 428, a deterioration factor adsorptive and/or reactive layer 429 covering them.

A passivation layer 404 containing, as a major component, silicon nitride or silicon oxynitride and passivating the lower electrode 414, the photoelectric conversion layer 42 and the upper electrode 428 is formed on the deterioration factor adsorptive and/or reactive layer 429. In the deterioration factor adsorptive and/or reactive layer 429 and the passivation layer 404, an aperture is formed at a position not overlapping the lower electrode 414 of the pixel part; and in the dielectric layer 411 and the passivation layer 404, an aperture is formed in a part on the bonding pad 420. Then, a wiring 418 made of aluminum, etc. for electrically connecting the upper electrode 428 and the bonding pad 420 exposed by these two apertures to each other and giving a potential to the upper electrode 428 is formed in the apertures and on the passivation layer 404. As a material of the wiring 418, an alloy containing aluminum such as Al—Si and Al—Cu alloys can also be used.

A passivation layer 403 containing, as a major component, silicon nitride, etc. for passivating the wiring 418 is formed on the wiring 418; an infrared light-shielding dielectric multilayered layer 402 is formed on the passivation layer 403; and an antireflection layer 401 is formed on the infrared light-shielding dielectric multilayered layer 402.

The lower electrode 414 achieves the same function as the lower electrode 2 as illustrated in FIG. 1. The photoelectric conversion layer 42 achieves the same function as the photoelectric conversion layer 3 as illustrated in FIG. 1. The upper electrode 428 achieves the same function as the upper electrode 4 as illustrated in FIG. 1. The deterioration factor adsorptive and/or reactive layer 429 achieves the same function as the deterioration factor adsorptive and/or reactive layer 5 as illustrated in FIG. 1.

According to the foregoing configuration, it is possible to detect lights of three colors of BGR in one pixel and to undergo color imaging. According to the configuration of FIG. 2, common values of R and B are used in two pixels, and only a value of G is separately used. However, since the sensitivity to G is important in forming a pixel, it is possible to produce a good color image even in such a configuration.

Furthermore, it is possible to inhibit deterioration of the device due to the deterioration factor after manufacture of the device by the function of the deterioration factor adsorptive and/or reactive layer 429.

EXAMPLES

Examples of the invention are hereunder described.

Example

A glass substrate in which a transparent electrode (layer thickness: 100 nm) made of ITO had been fabricated was used. Indium (layer thickness: 2 nm) was vacuum vapor deposited on the ITO electrode, and an electrode having a two-layer structure made of ITO and indium was used as a lower electrode (electron collecting electrode). On this lower electrode, Compound 1, 5,12-dihydroquino[2,3-b]acridine-7,14-dione (quinacridone; layer thickness: 100 nm) and Compound 2, 4,4',4''-tris(N-(3-methylphenyl)-N-phenylamino)triphenylamine (m-MTDATA; layer thickness: 100 nm) were successively stacked by vacuum vapor deposition, thereby preparing a photoelectric conversion layer. ITO (layer thickness: 10 nm) was further fabricated by high-frequency magnetron sputtering, thereby preparing an upper electrode (hole collecting electrode). The foregoing is a configuration of a photoelectric conversion device; and the effects of the indium layer and the m-MTDATA layer are described in detail in Japanese Patent Application No. 2005-251745 and Japanese Patent Application No. 2006-045955, respectively. Compound 3, tris(8-hydroxyquinolinato)aluminum(III) complex ($Alq_3$; layer thickness: 100 nm) was vacuum vapor deposited as a deterioration factor adsorptive and/or reactive layer so as to cover the whole of the thus prepared photoelectric conversion device. Finally, silicon nitride (layer thickness: 1 μm) was fabricated as a passivation layer by a plasma CVD method, thereby covering the deterioration factor adsorptive and/or reactive layer. The configuration of the device of this Example is one as illustrated in FIG. 1. Five samples of this device were prepared.

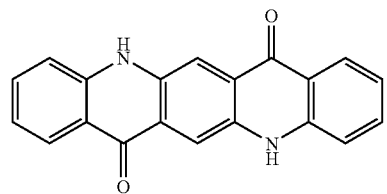

Compound 1

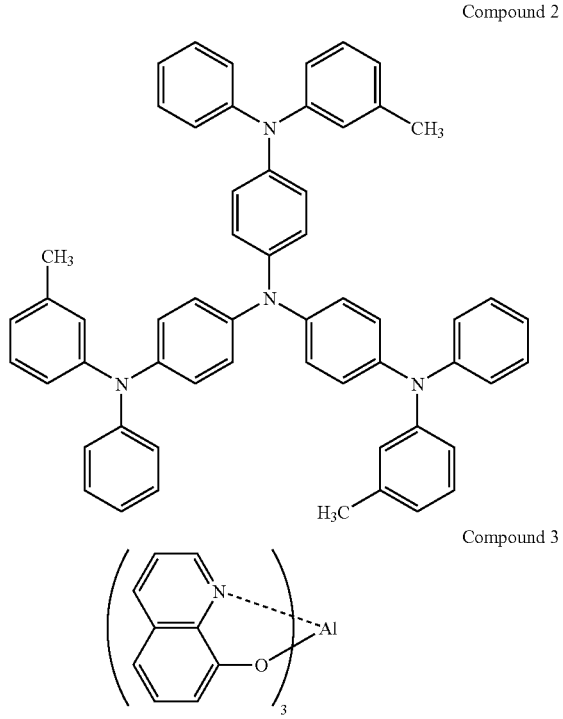

Compound 2

Compound 3

Comparative Example

A photoelectric conversion device was prepared in the same manner as in the Example, except that the deterioration factor adsorptive and/or reactive layer made of Alq$_3$ was not fabricated.

The upper electrode of each of the photoelectric conversion devices of the Example and Comparative Example was grounded; 2 V was applied to the lower electrode; light having a wavelength of 560 nm was irradiated at an intensity of 50 μW/cm$^2$ from a side of the upper electrode; and an external quantum efficiency and a dark current were measured. Furthermore, each of the photoelectric conversion devices was preserved in a dark place under a circumstance at a temperature of 23° C. and at a humidity of 50%, and after 200 hours, 500 hours and 800 hours, respectively, an external quantum efficiency and a dark current were measured. With respect to the five samples of each of the devices of the Example and Comparative Example, an average value of the external quantum efficiency and an average value of the dark current are shown in Table 1.

TABLE 1

| | | Immediately after the preparation of device | After 200 hours | After 500 hours | After 800 hours |
|---|---|---|---|---|---|
| External quantum efficiency (%) | Example | 5.1 | 5.7 | 5.9 | 5.9 |
| | Comparative Example | 4.9 | 5.4 | 6.2 | 7.0 |
| Dark current (A/cm$^2$) | Example | $9.1 \times 10^{-9}$ | $1.3 \times 10^{-8}$ | $1.3 \times 10^{-8}$ | $1.0 \times 10^{-8}$ |
| | Comparative Example | $5.4 \times 10^{-9}$ | $7.0 \times 10^{-8}$ | $2.0 \times 10^{-7}$ | $3.7 \times 10^{-7}$ |

It is thought that a change with time of each of the external quantum efficiency and the dark current of the photoelectric conversion device of the Example falls within a margin of scattering. On the other hand, in the device of the Comparative Example, though the external quantum efficiency does not change so much, the dark current increases with a lapse of time, and deterioration of the device is remarkable. For that reason, in particular, its application to a solid-state imaging device is improper. Here, in the device of the Comparative Example, while the external quantum efficiency is seemed to gradually increase with a lapse of time, this is a result from the deterioration in measurement precision due to a reduction of S/N by the increase of the dark current. Namely, the change of the external quantum efficiency of the device of the Comparative Example falls within a margin of error. Incidentally, in a photoelectric conversion device in which the deterioration factor adsorptive and/or reactive layer and the passivation layer are omitted, after 100 hours, not only the dark current exceeded $1 \times 10^{-6}$ A/cm$^2$, but also the measurement of the external quantum efficiency was impossible.

From these results, it was understood that in the photoelectric conversion device of the Example, even when a deterioration factor such as water and oxygen penetrates from a defective portion of the passivation layer, the deterioration factor and Alq$_3$ of the deterioration factor adsorptive and/or reactive layer react with each other so that the deterioration factor does not penetrate into the upper electrode, the photoelectric conversion layer and the lower electrode, whereby the performance of the device can be kept.

On the other hand, in the photoelectric conversion device of the Comparative Example, it is thought that the deterioration factor penetrated into the upper electrode, the photoelectric conversion layer and the lower electrode from a defective portion of the passivation layer, whereby in particular, indium of the lower electrode was oxidized. In each of the photoelectric conversion devices of the Example and the Comparative Example, the lower electrode (electron collecting electrode) is a stack of indium (work function: 4.3 eV) on ITO (work function: 4.8 eV). In this way, by stacking indium having a smaller work function than ITO, the injection of a hole from the lower electrode is inhibited, and the dark current of the photoelectric conversion device is reduced. However, when the indium is oxidized, the effect of indium vapor deposited on ITO disappears, whereby the injection of a hole is easy to occur. As a result, it is thought that the dark current of the device of the Comparative Example increased.

Furthermore, the number of a short circuit of the device at that time when ten samples of each of the photoelectric conversion devices of the Example and Comparative Example were prepared is shown in Table 2.

TABLE 2

| | Number of short circuit in ten devices |
|---|---|
| Example | 0 |
| Comparative Example | 5 |

From the foregoing results, it has become clear that by providing a deterioration factor adsorptive and/or reactive layer, there are give rise to effects for preventing the formation of a short circuit of the photoelectric conversion device and improving a yield.

This application is based on Japanese Patent application JP 2006-73160, filed Mar. 16, 2006, the entire content of which is hereby incorporated by reference, the same as if set forth at length.

What is claimed is:

1. A photoelectric conversion device comprising:
   a first electrode;
   a photoelectric conversion layer; and
   a second electrode, in this order,
   wherein the photoelectric conversion device further comprises:
   a deterioration factor adsorptive and/or reactive layer which covers the first electrode, the photo-electric conversion layer and the second electrode and which has at least one of adsorptivity of adsorbing a deterioration factor and reactivity of reacting with the deterioration factor; and
   a passivation layer which covers the deterioration factor adsorptive and/or reactive layer to protect the first electrode, the photoelectric conversion layer and the second electrode.

2. The photoelectric conversion device according to claim 1, wherein the first electrode is provided on a flat plane.

3. The photoelectric conversion device according to claim 1, wherein the deterioration factor adsorptive and/or reactive layer is made from a material capable of keeping a performance of the photoelectric conversion layer even after adsorption of the deterioration factor and reaction with the deterioration factor.

4. The photoelectric conversion device according to claim 1, wherein the deterioration factor adsorptive and/or reactive layer contains an organic material.

5. The photoelectric conversion device according to claim 4, wherein the deterioration factor adsorptive and/or reactive layer has the reactivity but does not have the adsorptivity, and the organic material is an organic semiconductor.

6. The photoelectric conversion device according to claim 4, wherein the passivation layer contains silicon nitride or silicon oxynitride.

7. The photoelectric conversion device according to claim 5, wherein the passivation layer contains silicon nitride or silicon oxynitride.

8. The photoelectric conversion device according to claim 1, wherein the deterioration factor adsorptive and/or reactive layer has at least the adsorptivity, and the deterioration factor adsorptive and/or reactive layer contains an inorganic material.

9. The photoelectric conversion device according to claim 8, wherein the inorganic material is a metal oxide or a metal fluoride.

10. The photoelectric conversion device according to claim 1, wherein the photoelectric conversion layer contains an organic material.

11. The photoelectric conversion device according to claim 4, wherein the photoelectric conversion layer contains an organic material.

12. The photoelectric conversion device according to claim 1, wherein a material for forming the deterioration factor adsorptive and/or reactive layer is a material which is formable by a physical vapor deposition method.

13. A solid-state imaging device comprising:
    a semiconductor substrate;
    the photoelectric conversion device according to claim 1; and
    a signal read-out part for reading out a signal corresponding to a signal charge generated in the photoelectric conversion device.

14. The solid-state imaging device according to claim 13, further comprising a photodiode provided in the semiconductor substrate, for detecting light which has transmitted through the photoelectric conversion device.

* * * * *